United States Patent [19]

Seok

[11] Patent Number: 5,255,234
[45] Date of Patent: Oct. 19, 1993

[54] REDUNDANT MEANS OF A SEMICONDUCTOR MEMORY DEVICE AND METHOD THEREOF

[75] Inventor: Yong-Sik Seok, Taegu, Rep. of Korea

[73] Assignee: SamSung Electronics Co., Ltd., Suwon, Rep. of Korea

[21] Appl. No.: 674,387

[22] Filed: Mar. 25, 1991

[30] Foreign Application Priority Data

Dec. 22, 1990 [KR] Rep. of Korea .............. 1990/21502

[51] Int. Cl.$^5$ ............................................. G11C 13/00
[52] U.S. Cl. ................................... 365/210; 365/200
[58] Field of Search ............... 365/222, 200, 210, 222, 365/189.01, 230.01

[56] References Cited
U.S. PATENT DOCUMENTS

4,951,253 8/1990 Sahara et al. .................... 365/200

Primary Examiner—Terrell W. Fears
Attorney, Agent, or Firm—Robert E. Bushnell

[57] ABSTRACT

There is disclosed a redundant device for a semiconductor memory device comprising a plurality of normal cell arrays each having sense amplifier comprising an isolation gate for isolating or connecting the bit lines between adjacent ones of the normal cell arrays in response to isolation signal, a redundant cell array connected only with one of the adjacent redundant cell arrays, a control signal generating device for generating the isolation signal and a sensing signal to control the sense amplifiers respectively corresponding with the normal cell array connected with the redundant cell array and the normal cell array not connected with the redundant cell array, and device for generating a redundant control signal in response to a defect of an externally inputted address signal and a signal to select a word line of the redundant cell array.

7 Claims, 6 Drawing Sheets

| | 100 | $\phi_{RE}$ | $\phi_{RC}$ | 102 | 103 | 104 | 105 | $\phi_{ISO}$ |
|---|---|---|---|---|---|---|---|---|
| R | H | H | L | 1/2Vcc | L | H | H | L |

REDUNDANT MEANS OF A SEMICONDUCTOR MEMORY DEVICE AND METHOD THEREOF

BACKGROUND OF THE INVENTION

The present invention concerns a semiconductor memory device, and more particularly a redundant means and method for replacing a defective memory cell of a semiconductor memory cell with a redundant memory cell.

A semiconductor memory device comprises a plurality of memory cells arranged in rows and columns, the number of which cells depends on the memory capacity. As the number of the memory cells is increased, the probability of defective memory cells is also increased. The semiconductor memory device cannot be used even with a memory cell being defective.

Conventionally, a redundant memory cell array is arranged in the columns and rows of a normal memory cell array so as to operate a semiconductor memory device regardless of a defective memory cell, thus increasing the yield of semiconductor memory devices. Such a conventional repair method for replacing a defective memory cell array with a redundant cell array is generally achieved with a laser or electrical redundant means.

An electrical redundant means for a semiconductor memory device is disclosed in U.S. Pat No. 4,392,211, wherein a high voltage current should be used in order to cut off a fuse, so that the size of the transistor for conducting the current must be sufficiently large. Hence, the chip size is increased, and the high voltage current causes a damage to the chip.

In order to resolve the drawbacks of the electrical redundant means, there was proposed a laser redundant means of high cost in U.S. Pat. No. 4,228,528, wherein laser is used to cut off the fuses of the rows or columns with a defective cell. In this case, there must be arranged a fuse for each of the bit lines and word lines connected with the memory cell array, so that the word line or bit line with a defective memory cell may be cut off. As, the memory capacity is increased, the interval between the fuses arranged in the word and bit lines is decreased. Consequently, the size of the laser spot for cutting off the fuse must be decreased, or otherwise the adjacent normal word or bit lines or the fuses thereof may be damaged while the cutting off the fuse of a word or bit line linked with a defective memory cell.

For example, assuming the diameter of the spot is 4-5 microns in the case of 256K DRAM, it should be 2.5-4 microns in 1M DRAM, and more reduced over 4M DRAM, so that there must be used a laser means for obtaining a smaller spot with very small tolerance. As a result the laser means is impossible to practically apply to a highly integrated memory device of megaorder.

Figure 1:
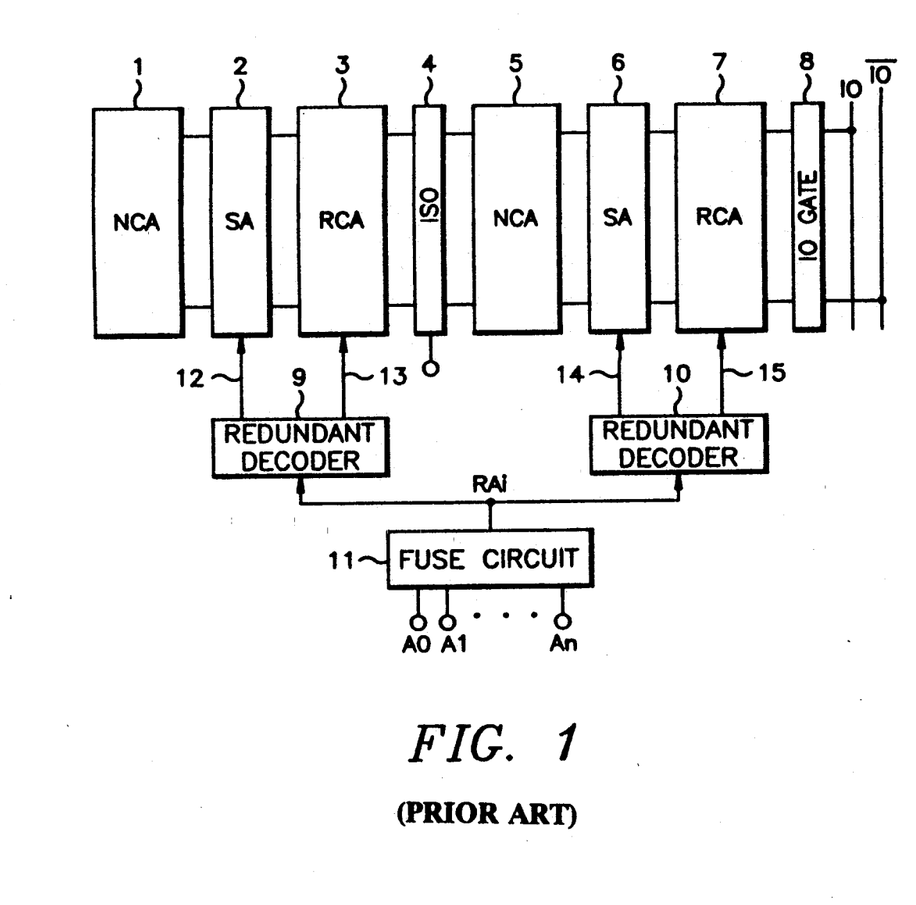
FIG. 1 is a block diagram for illustrating a memory device with a conventional redundant means.

In such a circumstance, there has been proposed a method for decoding a spare memory cell, i.e., redundant memory cell by internally addressing when a normal memory cell has a defect. Referring to FIG. 1 for showing a block diagram of a semiconductor memory device using the internal address decoding, there are arranged respectively on the left and right sides of isolation gate 4 left normal cell array 1 with left redundant cell array 3 and right normal cell array 5 with right redundant cell array 7. The memory cell groups also have respectively sense amplifiers 2 and 6. An input-/output gate 8 is interposed between the right redundant memory cell array 7 and input/output lines IO and $\overline{IO}$.

Thus, each of the normal cell arrays has a corresponding redundant cell array that is selected by a corresponding decoder 9 or 10 according to a redundant address signal RAi from a fuse box 11. In other words, if the left normal cell array 1 has a defect, the left redundant cell array 3 is used, while the right normal cell array 5 has a defect, the right redundant cell array 7. Hence, the size of a semiconductor memory chip comprising a plurality of memory cell groups is considerably increased because there must be arranged a respective redundant cell array on both sides of the isolation gate 4. This makes very difficult to highly integrate a semiconductor memory device. Moreover, if a defect occurs in the left normal cell array 1, to sense the data in the left redundant cell array 3 is carried out by transmitting read out data via left sense amplifier 2-isolation gate 4-right sense amplifier 6-input/output gate 8, while if a defect occurs in the right normal cell array 5, to sense the data in the right redundant cell array 7 is carried out by transmitting read out data via right sense amplifier 6-input/output gate 8, thereby resulting in unbalanced power consumption. This may cause instability of the whole power consumption.

SUMMARY OF THE INVENTION

It is an object of the present invention to provide a redundant means that is adaptable for highly integrating a semiconductor memory device comprising redundant memory cell array.

It is another object of the present invention to provide a means and method for making a semiconductor memory device have an optimum redundant efficiency.

According to the present invention, there is provided a redundant means for a semiconductor memory device comprising a plurality of normal cell arrays each having sense amplifier comprising an isolation gate for isolating or connecting the bit lines between adjacent ones of the normal cell arrays in response to isolation signal, a redundant cell array connected only with one of the adjacent redundant cell arrays, a control signal generating means for generating the isolation signal and a sensing signal to control the sense amplifiers respectively corresponding with the normal cell array connected with the redundant cell array and the normal cell array not connected with the redundant cell array, and means for generating a redundant control signal in response to a defect of an externally inputted address signal and a signal to select a word line of the redundant cell array.

According to one aspect of the present invention, in a semiconductor memory device comprising a plurality of normal cell arrays each having sense amplifier, a redundant method for replacing a normal cell array having a defect with an internal redundant cell array in response to a defect of an externally inputted address signal comprises the steps of connecting the redundant cell array only with the sense amplifier of any one of adjacent normal cell arrays, arranging an isolation gate between the bit lines of the normal cell array connected with the redundant cell array and the normal cell array not connected with the redundant cell array, the isolation gate isolating or connecting the bit lines in response to an isolation signal, and respectively applying to the sense amplifier and isolation gate a sensing control signal corresponding to a redundant control signal of a first or second state in response to the defect of the externally inputted address signal and said isolation signal, whereby the data stored in the redundant cell array is outputted through the sense amplifier connected with the redundant cell array during the redundant control signal being in the second state.

The present invention will now be described more specifically with reference to the drawings attached only by way of example.

DETAILED DESCRIPTION OF A CERTAIN PREFERRED EMBODIMENT

Figure 2:
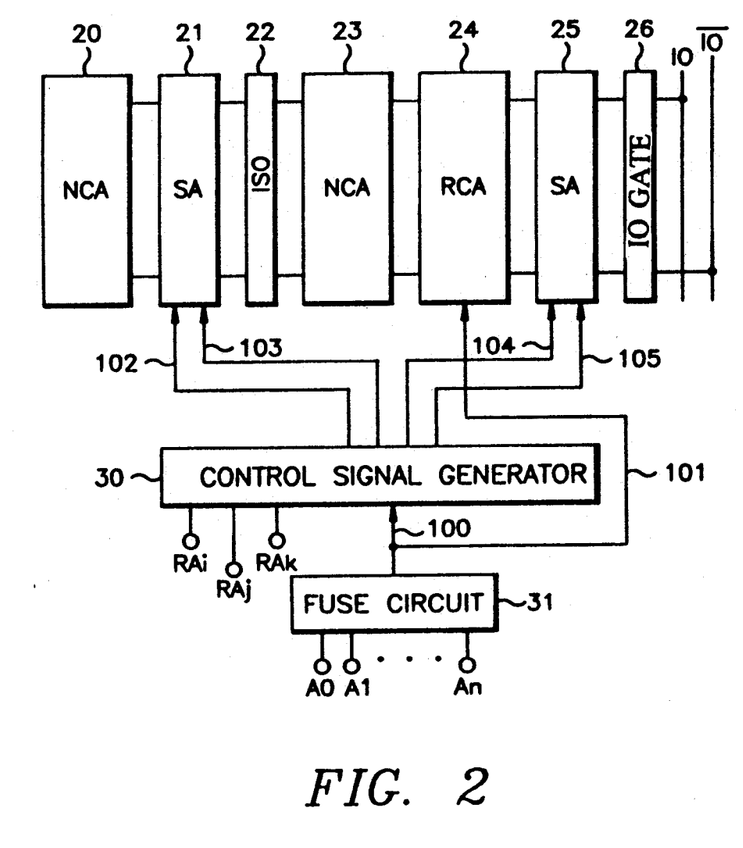
FIG. 2 is a block diagram for illustrating a memory device with an inventive memory means.

Referring to FIG. 2, on the left and right sides of isolation gate 22 is respectively arranged a first normal cell array 20 and second normal cell array 23. A sense amplifier 21 connected with the first normal cell array 20 is arranged between the first normal cell array 20 and isolation gate 22. Between the second normal cell array 23 and input/output lines IO and $\overline{IO}$ are sequentially connected a redundant cell array 24, a sense amplifier 25 and an input/output gate 26. Although the sense amplifiers 21 and 25 are used in the normal mode, the right sense amplifier 25 connected with the redundant cell array 24 is only operated to amplify the read-out data from a redundant cell in the redundant mode. This is the characteristic of the inventive means.

The left and right sense amplifiers 21 and 25 respectively receive a first and second sensing control signals 102 and 103, and a third and fourth sensing control signals 104 and 105 from a control signal generating means 30, which in turn receives a redundant control signal 100 from a fuse circuit 31. A cell of the redundant cell array 24 is selected according to a redundant selecting signal 101 from the fuse circuit 31. The control signal generating means 30 includes is to generate the first, second, third and fourth sensing control signals 102, 103, 104 and 105. The fuse circuit 31 is to sense a defective address signal in response to redundant address signals RA1/$\overline{RA1}$ ... RAn/$\overline{RAn}$.

Figure 3:
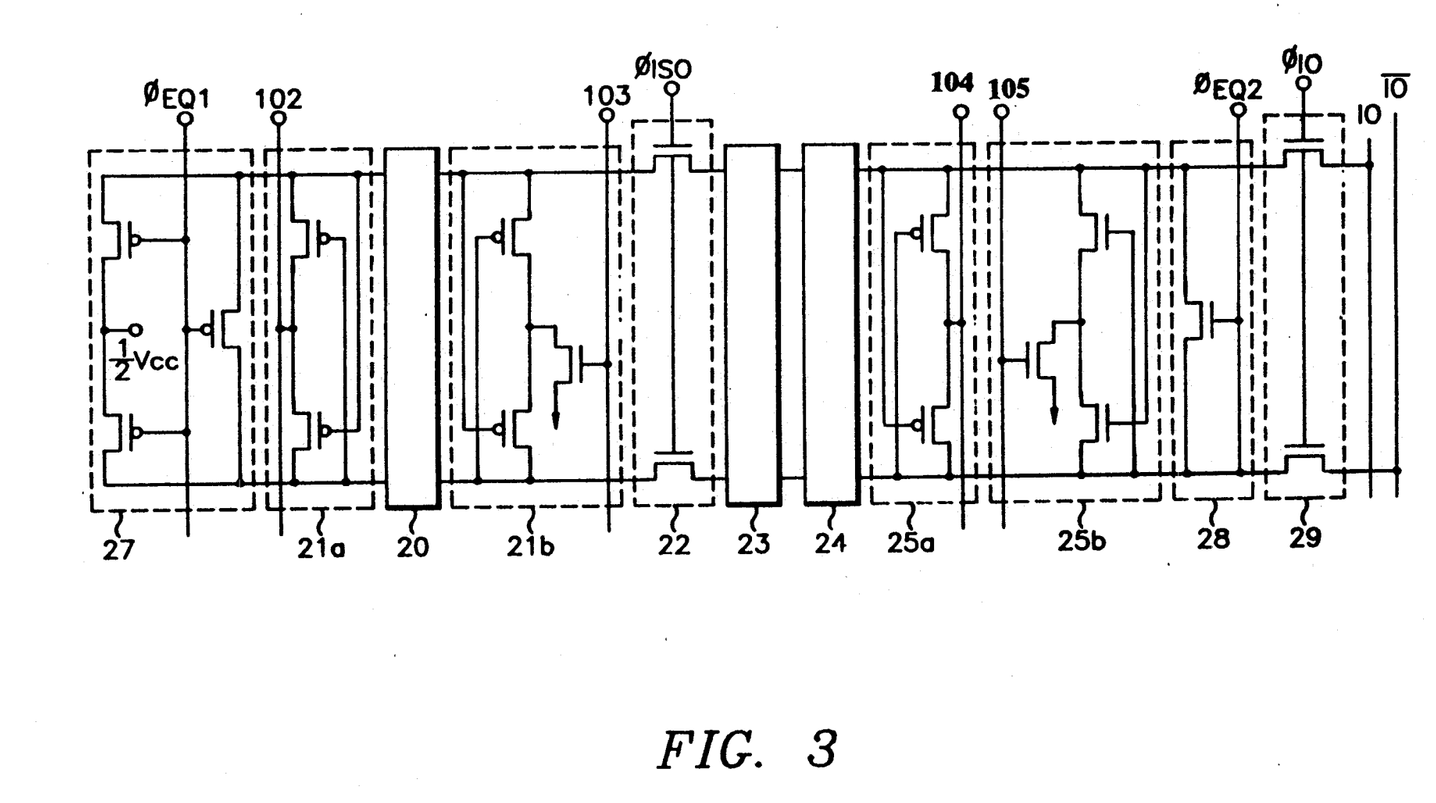
FIG. 3 is a detailed circuit diagram for illustrating the memory cell and sense amplifier of FIG. 2.

FIG. 3 shows the relationship between the normal and redundant cell arrays 20, 23 and 24, the left and right sense amplifiers 21 and 25, isolation gate 22, input/output gate 29, and equalization circuits 27 and 28 of bit lines.

The left sense amplifier circuit 21 comprises a first sense amplifier 21a and second sense amplifier 21b. The first sense amplifier 21a consists of two latch-type PMOS transistors, receiving the first sensing control signal 102. The second sense amplifier 21b consists of two latch-type NMOS transistors and a drive NMOS transistor, receiving the second sensing control signal 103. The right sense amplifier circuit 25 comprises a third sense amplifier 25a and fourth sense amplifier 25b. The third sense amplifier 25a consists of two latch-type PMOS transistors, receiving the third sensing control signal 104. The fourth sense amplifier 25b consists of two latch-type NMOS transistors and a drive NMOS transistor, receiving the fourth sensing control signal 105.

The isolation gate 22 consists of transfer transistors with the channels respectively connected between the internal and external bit line pairs BLO/$\overline{BLO}$, BLI/$\overline{BLI}$ and the gates commonly receiving an isolation signal φISO. The internal circuits of the sense amplifier and isolation gate has been known as conventional ones.

Between the external and internal bit line pairs BLO/$\overline{BLO}$, BLI/$\overline{BLI}$ are respectively connected the equalization circuits 27 and 28 of the bit lines. Usually, the equalization level of the bit lines of a DRAM is ½ Vcc applied to the equalization circuit 27 connected between the external bit line pair BLO/BLO'. The normal cell array 20 is interposed between the first and second sense amplifiers 21a and 21b, while the second normal array 23 and redundant cell array 24 are interposed between the isolation gate 22 and third sense amplifier 25a. An input/output gate 29 is interposed between the equalization circuit 28 of the internal bit lines and input/output lines IO, $\overline{IO}$. As shown in FIG. 3, the redundant cell array 24 is only provided on the right side of the isolation gate 22, which differs from FIG. 1 where each normal cell array has a corresponding redundant cell array.

Figure 4:
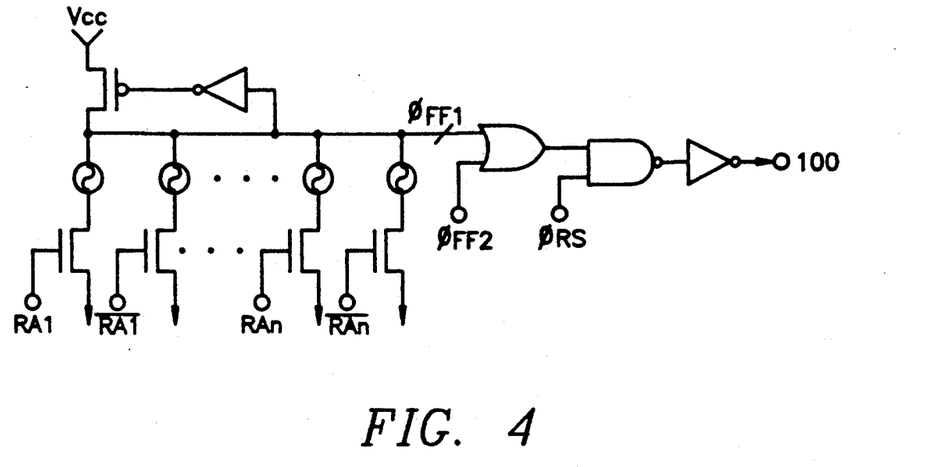
FIG. 4 illustrates a circuit for generating a redundant control signal φPRE according to the present invention.

Referring to FIG. 4 for illustrating a redundant control signal 100 being generated from the fuse circuit 31 of FIG. 2, the fuses connected between the output terminal of fuse signal φ FF01 and NMOS transistors with the gates respectively connected with redundant address signals RA1/$\overline{RA1}$ ... RAn/$\overline{RAn}$ are cut off when the corresponding NMOS transistors are driven a defective address signals. Hence, if there is a defective address signal, the fuse signal φFF01 or φFF02 becomes "high". The redundant control signal 100 is determined by the fuse signal φFF01 indicating the address defect.

Likewise, it is well known that the signal 101 for selecting a word line of the redundant cell array 24 is determined by the fuse signals φ FF01, φ FF02, which is not shown in FIG. 4.

Figure 5:
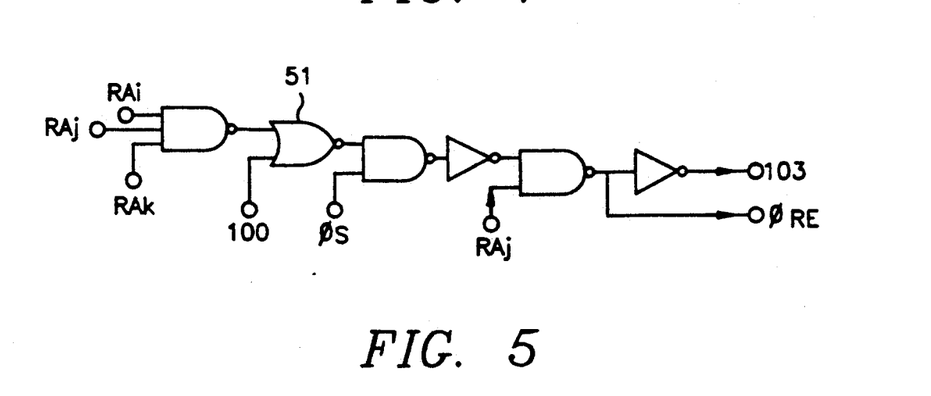
FIG. 5 illustrates a circuit for generating a second sensing control signal (103) according to the present invention.

Referring to FIG. 5 for illustrating a circuit for generating the second sensing control signal 103 and a first pre-sensing control signal φ RE according to the present invention, the second sensing control signal 103 and first presensing control signal φ RE varies according to the output of a NOR gate 51 receiving the redundant control signal 100 generated from the circuit of FIG. 4. A reset signal φ RS is always in "high" state during the operation, and RAi, RAj, RAk represent redundant signals.

Figure 6:
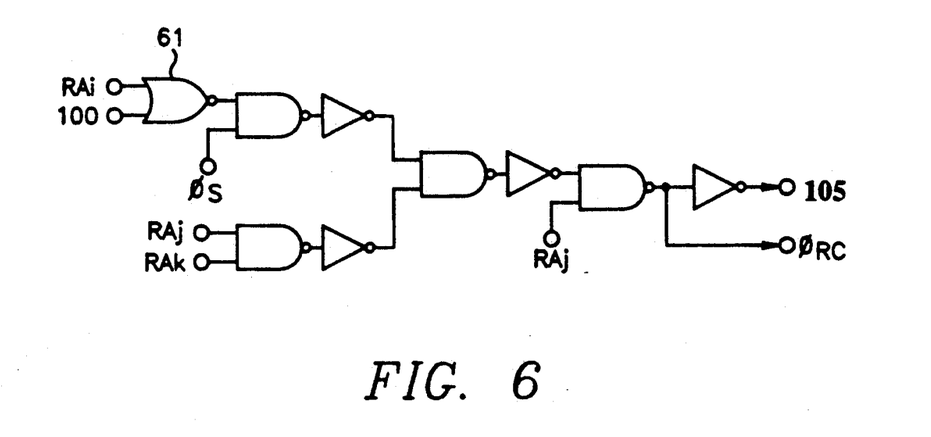
FIG. 6 illustrates a circuit for generating a fourth sensing control signal (104) according to the present invention.

Referring to FIG. 6 for illustrating a circuit for generating the fourth sensing control signal 105 and a second pre-sensing signal φ RC according to the present invention, the fourth sensing control signal 105 and second pre-sensing signal φ RC are determined by the redundant control signal 100 received by a NOR gate 61.

Figure 7:
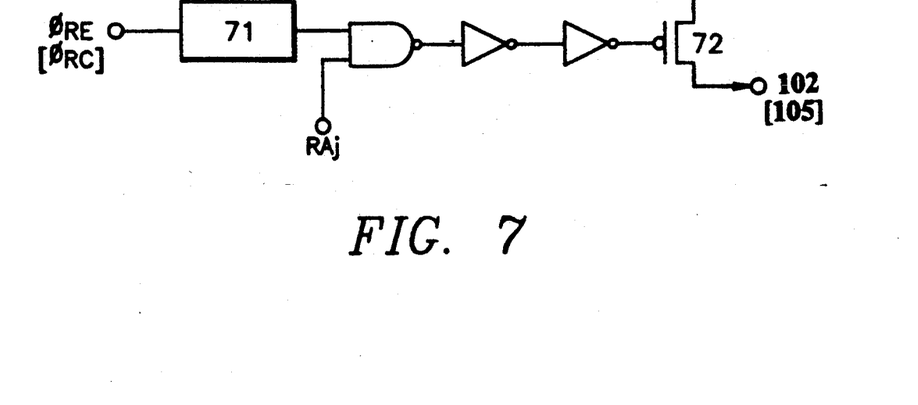
FIG. 7 illustrates a circuit for generating a first and third sensing control signals (101, 102)

Referring to FIG. 7, the first or second pre-sensing signal φ RE or φ RC inputted into a delay circuit 71 is outputted through a drive PMOS transistor 72 as the first or third sensing control signal 102 or 104.

Figure 8:
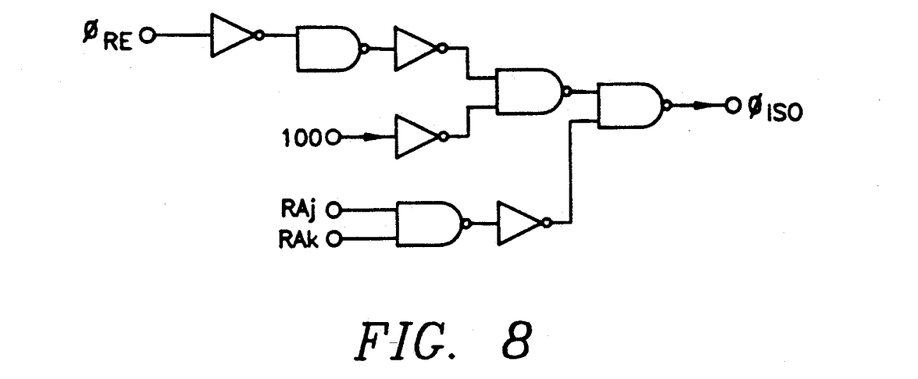
FIG. 8 illustrates a circuit for generating a isolation signal φISO according to the present invention.

Referring to FIG. 8, an isolation signal φ ISO applied to the isolation gate 22 responds to the normal pre-sensing signal φ RE.

As shown in FIGS. 4 to 8, the first, second, third and fourth sensing control signals 101, 103, 102 and 104, and the isolation signal φ ISO depend on the redundant control signal 100 formed from the fuse signals φ FF01, φ FF02 sensing a defective address.

Figure 9:
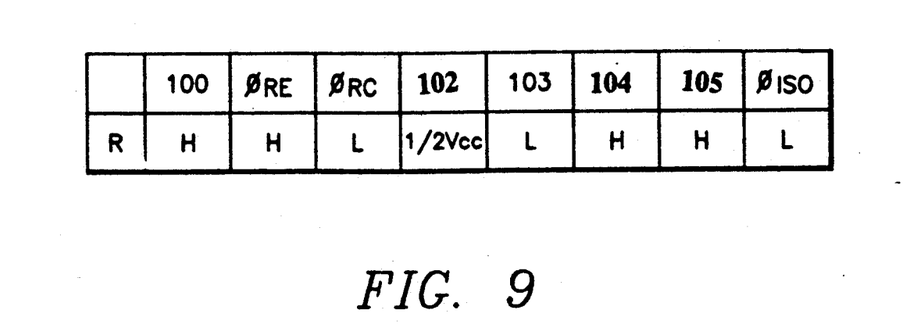
FIG. 9 is a table for showing the states of the control signals according to the present invention.

Referring to FIG. 9, if the redundant control signal 100 is in "high" state ("low" state in the normal operation mode), the levels of the first pre-sensing signal φRE, second pre-sensing signal φRC, the first, second, -third and fourth sensing control signals 102, 103, 104 and 105, and the isolation signal φ ISO are respectively "high", "low", "½ Vcc", "low", "high", "high", and "low". The signals also make it possible to sense the data read out from the first or second normal cell array in the normal operation mode.

Figure 10:
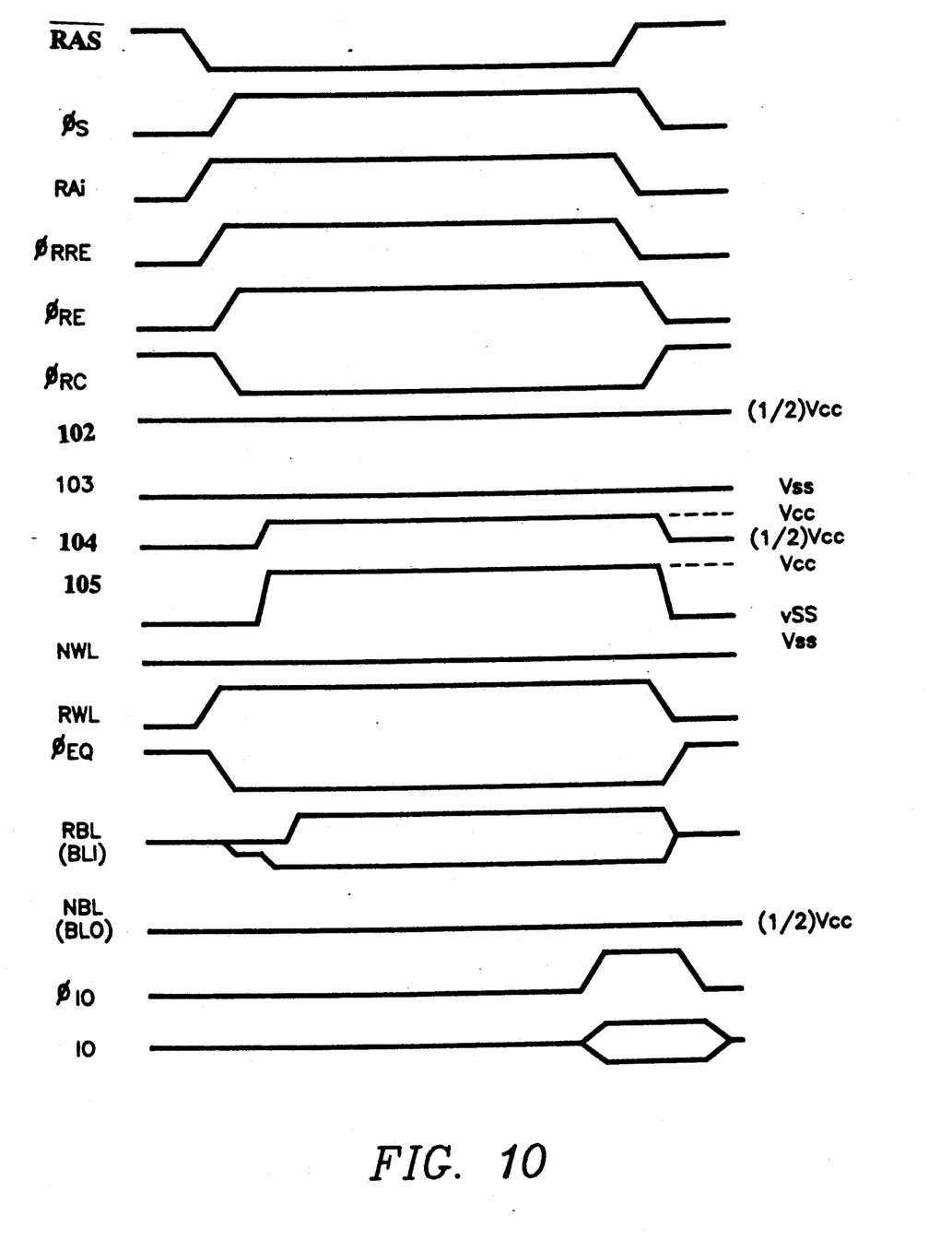
FIG. 10 is a timing diagram for illustrating the operation of the inventive means.

Referring to FIG. 10 for illustrating the operation of the inventive circuit in the redundant mode, the reference numeral $\overline{RAS}$ represents row address strobe signal, NWL the voltage level of the redundant word line in the normal cell array, RBL the voltage level of the bit line ( or the internal bit line BLI of FIG. 3) connected with the redundant cell array 24, and NBL the voltage level of the bit line (or the external bit line BLO of FIG. 3) connected with the first normal cell array.

Hereinafter, the redundant operation according to the present invention will now be described with reference to FIG. 10.

If one of the address signals RAi has a defect, the fuse signal φ FF01 of FIG. 4 becomes "high", so that the redundant control signal 100 becomes "high" The fuse signal φ FF01 of "high" state causes the redundant word line RWL to be in "high" state. At this time, the normal word line NWL is not selected remaining in ground level because a defect has occurred in the corresponding address signal.

Since the redundant control signal 100 is "high" state, the output of the NOR gate 51 of FIG. 5 becomes "low", and therefore the second sensing control signal 103 and first free sensing signal φ RE respectively become "low" and "high".

Meanwhile, the output of the OR gate 61 of FIG. 6 becomes "high" because of the redundant control signal 100 of "high" state, and the fourth sensing control signal 105 and second presensing signal φ RC respectively become "high" and "low" because of the redundant address signal RAj or RAk of "high" state.

Hence, the first and third sensing control signals 102 and 104 of FIG. 7 respectively become "low" and "high".

Since the first and second sensing control signals 102 and 103 are respectively in "½ Vcc" and "low" state, the first and second sense amplifiers 21a and 21b of FIG. 3 are disabled, while the third and fourth sense amplifiers 25a and 25b connected with the redundant cell array 24 of FIG. 3 are operated. Namely, the first or second normal cell array 20 or 23 where a defect has occurred operates only the sense amplifier connected with the redundant cell array 24 so as to replace the defective normal cell with the redundant cell. Of course, the sense amplifiers 21a, 21b, 25a, 25b are to sense the data read out from the normal cell array in the normal operation mode.

If the third and fourth sense amplifiers 25a and 25b make sensing operation, the internal bit lines BLI, $\overline{BLI}$ connected with the redundant cell array 24 are isolated, and the sufficiently amplified data are transmitted through the input/output gate 29 to the input/output lines IO/$\overline{IO}$. Meanwhile, the isolation signal φ ISO is in "low" state due to the first pre-sensing signal φRE of "low" state in FIG. 8, so as to isolate the external bit line pair BLO, $\overline{BLO}$ and the internal bit line pair BLI, $\overline{BLI}$.

The reason that the data is sensed only from the redundant cell array 24, even though the third and fourth sense amplifiers 25a and 25b are connected with the second normal cell array 23 is that the fuse signal φ FF01 of FIG. 4 causes the redundant word line RWL to be selected and not the normal word line NWL.

In the normal mode, the redundant control signal 100 becomes "low", and the fuse signal φ FF01 changes the state so as to cause the normal word line NWL to be selected and not the redundant word line RWL, so that third and fourth sense amplifier 25a and 25b amplify the data read out from the selected normal cell array.

As described above, it is not necessary to provide each of the normal cell array with a separate redundant cell array in order to replace a defective memory cell in a memory device with sense amplifiers (for example, in FIG. 3, the first normal cell array 20 connected with the first and second sense amplifiers 21a and 21b, the second normal cell array 23 connected with the third and fourth sense amplifiers 25a and 25b), according to the present invention. In the present invention, a single redundant cell array 24 performs redundancy for both the first and the second normal cell arrays 20 and 23, thus making possible to decrease the size of a memory device and thereby improving its rate of integration.

What is claimed is:

1. A redundant means for a semiconductor memory device comprising a plurality of normal cell arrays each having sense amplifier, comprising:
    an isolation gate for isolating or connecting the bit lines between adjacent ones of said normal cell arrays in response to an isolation signal;
    a redundant cell array at least connected only with one of said adjacent normal cell arrays;
    a control signal generating means for generating said isolation signal and a sensing signal to control the sense amplifiers respectively corresponding with one of said normal cell arrays connected with said redundant cell array and the other of said normal cell arrays not connected with said redundant cell array; and
    a means for generating a redundant control signal in response to the defect of an externally inputted address signal and a signal to select a word line of said redundant cell array.

2. A redundant means as claimed in claim 1, wherein said redundant cell array is arranged to be near to an input and output line.

3. A redundant means of a semiconductor memory device for replacing a normal cell having a defect with an internal redundant cell in response to an error in an externally inputted address signal, comprising:
    a redundant cell array connected only with one of adjacent normal cell arrays each having a sense amplifier, said redundant cell array generating stored data through the sense amplifier of said one normal cell array in redundant operation mode;

isolation gate means for selectively isolating and connecting the bit liens between one of said normal cell arrays connected with said redundant cell array and the other normal cell arrays not connected with said redundant cell array in, response to said isolation signal;

control signal generating means for generating said isolation signal and a sensing signal to control the sense amplifiers respectively corresponding with said one of said normal cell arrays connected with said redundant cell array and said other of said normal cell arrays not connected with said redundant cell array; and means for generating a redundant control signal in response to the error in said externally inputted address signal and a signal to select a word line of said redundant cell array.

4. A redundant means as claimed in claim 3, wherein said redundant cell array is arranged adjacent at least to input and output line.

5. In a semiconductor memory device comprising a plurality of normal cell arrays each having sense amplifier, a redundant method for replacing a normal cell array having a defect with an internal redundant cell array in response to a defect of an externally inputted address signal comprising the methods of:

connecting said redundant cell array only with the sense amplifier employed in any one of adjacent normal cell arrays;

arranging an isolation gate between the bit lines of one of said normal cell array connected with said redundant cell array and the other of said normal cell array not connected with said redundant cell array, said isolation gate isolating or connecting said bit lines in response to an isolation signal; and respectively applying to said sense amplifier and isolation gate a sensing control signal corresponding to a redundant control signal of a first or second state in response to the defect of said externally inputted address signal and said isolation signal, whereby the data stored in said redundant cell array is outputted through the sense amplifier connected with said redundant cell array during said redundant control signal being in the second state.

6. A redundant method as claimed in claim 5, wherein the word lines of said normal cell array are disabled and the word lines are only enabled during said redundant control signal being in the second state.

7. A redundant method as claimed in claim 5, wherein only the sense amplifier connected with said redundant cell array is operated during said redundant control signal being both in the first and second state, while said isolation gate is not operated during said redundant control signal being in the second state.

* * * * *

UNITED STATES PATENT AND TRADEMARK OFFICE
CERTIFICATE OF CORRECTION

PATENT NO. : 5,255,234

DATED : 19 October 1993

INVENTOR(S) : Yong-Sik SEOK

It is certified that error appears in the above-identified patent and that said Letters Patent is hereby corrected as shown below:

Claim 3,   Column 7,   Line 2,   change ";" to --:--; and

Column 7,   Line 4,   change "liens" to --lines--.

Signed and Sealed this

Twenty-ninth Day of March, 1994

Attest:

BRUCE LEHMAN

Attesting Officer      Commissioner of Patents and Trademarks